United States Patent
Jang

(10) Patent No.: US 6,255,173 B1
(45) Date of Patent: Jul. 3, 2001

(54) METHOD OF FORMING GATE ELECTRODE WITH TITANIUM POLYCIDE STRUCTURE

(75) Inventor: Se Aug Jang, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/466,741

(22) Filed: Dec. 17, 1999

(30) Foreign Application Priority Data

Dec. 22, 1998 (KR) .................................................. 98-57315

(51) Int. Cl.$^7$ ................................................ H01L 21/8236
(52) U.S. Cl. .......................... 438/279; 438/299; 438/303; 438/592; 438/595; 438/655; 438/656; 438/721
(58) Field of Search .................................. 438/279, 592, 438/721, 303, 299, 595, 655, 656

(56) References Cited

U.S. PATENT DOCUMENTS

| | | |
|---|---|---|
| 4,635,347 | 1/1987 | Lien et al. . |
| 4,900,257 | 2/1990 | Maeda . |
| 5,045,916 * | 9/1991 | Vor et al. ................................ 357/71 |
| 5,286,678 * | 2/1994 | Rastogi ................................ 437/200 |
| 5,508,212 * | 4/1996 | Wang et al. ............................ 437/24 |
| 5,668,394 | 9/1997 | Lur et al. . |
| 5,677,217 | 10/1997 | Tseng . |
| 5,744,395 | 4/1998 | Shue et al. . |
| 5,747,373 | 5/1998 | Yu . |
| 5,811,354 | 9/1998 | Yzng . |
| 5,858,831 | 1/1999 | Sung . |
| 5,879,986 | 3/1999 | Sung . |
| 6,001,718 * | 12/1999 | Katata ................................... 438/592 |
| 6,069,045 * | 5/2000 | Fujii et al. ............................ 438/303 |
| 6,150,214 * | 11/2000 | Kaeriyama ........................... 438/253 |

OTHER PUBLICATIONS

S. Wolf, Silicon Processing for the VLSI Era, vol. 2, pp. 144–152, Lattice Press, Jan. 1990.*

* cited by examiner

*Primary Examiner*—Matthew Smith
*Assistant Examiner*—Belur V Keshavan
(74) *Attorney, Agent, or Firm*—Selitto, Behr & Kim

(57) ABSTRACT

A method of forming a gate electrode with a titanium polycide structure capable of preventing abnormal oxidation of the gate electrode when performing gate re-oxidation process, is disclosed. In the present invention, after forming a gate electrode having a stacked structure of a polysilicon layer and a titanium silicide layer, thermal-treating is performed under nitrogen atmosphere to form a TiN layer on the side wall of the titanium silicide layer, considering as silicon content of the titanium silicide layer is high, abnormal oxidation decreases. At this time, a titanium silicide layer having deficient Ti is formed on the side wall of the titanium silicide layer adjacent to the TiN layer. Therefore, after removing the TiN layer, the side wall of the titanium silicide layer having excessive Si (or deficient Ti) is exposed. Thereafter, gate re-oxidation process is performed. At this time, abnormal oxidation of the titanium silicide layer is prevented by the titanium silicide layer having excessive silicon.

9 Claims, 4 Drawing Sheets

METHOD OF FORMING GATE ELECTRODE WITH TITANIUM POLYCIDE STRUCTURE

BACKGROUND OF THE INVENTION

1. Field of the Invention

The present invention relates to a method of manufacturing a semiconductor device, particularly to a method of forming a gate electrode for a MOSFET, and more particularly to a method of forming a gate electrode with a titanium polycide structure.

2. Description of the Related Art

In general, a gate electrode of a MOS transistor has been formed of a doped polysilicon layer. However, as high integration of semiconductor device, the line width of a gate electrode and other patterns becomes fine. Recently, the line width is reduced below 0.15 $\mu$m. Therefore, there are problems that it is difficult to apply the doped polysilicon layer to a gate electrode material in a high speed device, since the doped polysiliocn layer has a high resistivity. These problems are also growing more and more serious as the high integration of the semiconductor. To overcome these problems, a gate electrode with a titanium polycide structure in which a titanium silicide layer is formed on the polysilicon layer, is applied to a semiconductor device of IG DRAM or more.

Here, the titanium silicide layer is formed by two methods as follows.

A first method deposits a titanium (Ti) layer on a polysilicon layer and performs annealing, to react the Ti with Si of the polysilicon layer, thereby forming a titanium silicide ($TiSi_2$) layer. A second method deposits a $TiSi_x$ layer of an amorphous phase on a polysilicon layer by physical vapor deposition (PVD) using a $TiSi_x$ sputtering target and performs annealing, thereby forming a $TiSi_2$ layer of a crystalline phase.

FIG. 1A to FIG. 1E are cross sectional views describing a method of forming a gate electrode with a titanium polycide structure in which a titanium silicide layer is formed on the polysilicon layer according to the prior art using the second method.

Referring to FIG. 1A, a gate oxide layer 11 is grown on a semiconductor substrate 10 and a doped polysilicon layer 12 is deposited thereon. Referring to FIG. 1B, a $TiSi_x$ layer 13 of an amorphous phase is deposited on the polysilicon layer 12 by PVD using a $TiSi_x$ target.

Referring to FIG. 1C, rapid thermal process (RTP) is performed at a selected temperature for several seconds to transform the $TiSi_x$ layer 13 of the amorphous phase into a $TiSi_2$ layer 13a of a crystalline phase. Next, for performing subsequent process such as self-aligned contact (SAC), a mask nitride layer (or oxide layer) is deposited on the $TiSi_2$ layer 13a.

Referring to FIG. 1D, the mask nitride layer 14, the $TiSi_2$ layer 13a and the polysilicon layer 12 are etched to form a gate electrode.

Referring to FIG. 1E, for removing damage and polysilicon residues due to the etching process and recovering the reliability of the gate oxide layer 11 by forming a bird's beak, gate re-oxidation process is performed by well known method, so that an oxide layer 15 is formed on the side wall of the gate electrode.

However, when performing the gate re-oxidation process, the side wall portion of the $TiSi_2$ layer 13a is excessively oxidized, as shown in FIG. 1E, thereby increasing the resistivity of the gate electrode. Here, the oxidation of the $TiSi_2$ layer 13a is related to the mole ratio x of Si:Ti in the $TiSi_x$ sputtering target. More specifically, while in case the mole ratio x is below 2.1, the $TiSi_2$ layer is excessively oxidized, in case the mole ratio x is over 2.4, the $TiSi_2$ layer is moderately oxidized without any deformation. Namely, when silicon content of the $TiSi_x$ sputtering target is stoichiometrically excessive, the oxidation rate of the $TiSi_2$ layer 13a is equalized to that of the polysilicon layer 12, so that the gate re-oxidation process can be performed.

However, the more the silicon content is high, the more particles increase, so that it is limited to use the $TiSi_2$ target having silicon content of 2.4 or more.

SUMMARY OF THE INVENTION

It is therefore an object of the present invention to provide a method of forming a gate electrode with a titanium polycide structure capable of preventing abnormal oxidation of the gate electrode when performing gate re-oxidation process.

In the present invention, after forming a gate electrode having a stacked structure of a polysilicon layer and a titanium silicide layer, thermal-treating is performed under nitrogen atmosphere to form a TiN layer on the side wall of the titanium silicide layer, considering as the relative silicon content in the titanium silicide layer is high, abnormal oxidation decreases. At this time, a titanium silicide layer having deficient Ti is formed on the side wall of the titanium silicide layer adjacent to the TiN layer. Therefore, after removing the TiN layer, the side wall of the titanium silicide layer having excessive Si (or deficient Ti) is exposed. Thereafter, gate re-oxidation process is performed. At this time, abnormal oxidation of the titanium silicide layer is prevented by the titanium silicide layer having excessive silicon.

To accomplish this above objects, a method of forming a gate electrode with a titanium polycide structure according to the present invention, includes the steps of: forming a gate insulating layer and a polysilicon layer on a semiconductor substrate, in sequence; forming a titanium silicide layer on the polysilicon layer; sequentially etching the titanium silicide layer and the polysilicon layer to form a gate electrode; thermal-treating the resultant substrate under nitrogen atmosphere to form a TiN layer on the side wall of the titanium silicide layer and to form excessive silicon layer on the titanium silicide layer adjacent to the TiN layer; removing the TiN layer; and performing gate re-oxidation process.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained with reference to accompanying drawings.

FIG. 2A to FIG. 2F are cross sectional views describing a method of forming a gate electrode with a titanium polycide structure according to an embodiment of the present invention.

Figure 1A:
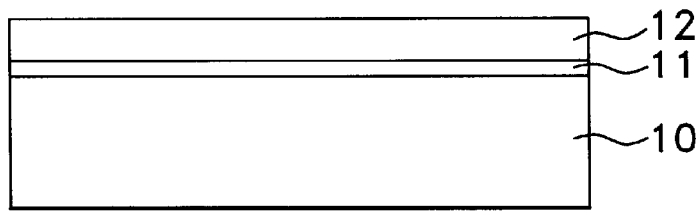
FIG. 1A to FIG. 1E are cross sectional views describing a method of forming a gate electrode with a titanium polycide structure according to the prior art.
Figure 1B:
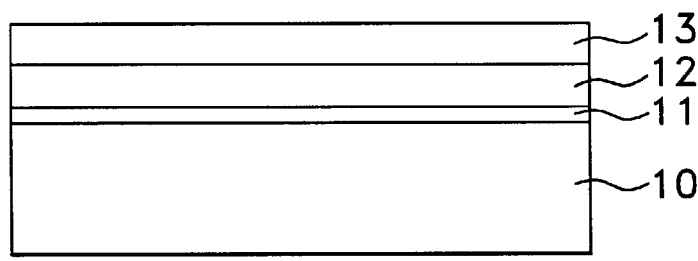
Figure 1C:
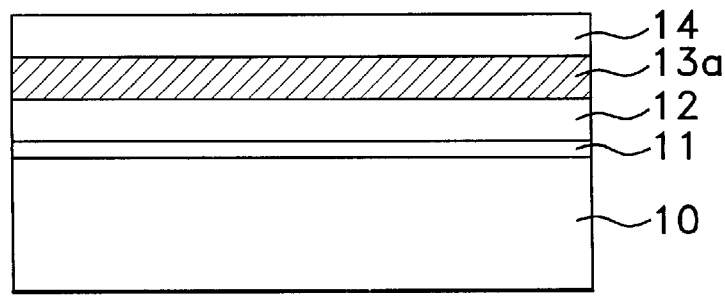
Figure 1D:
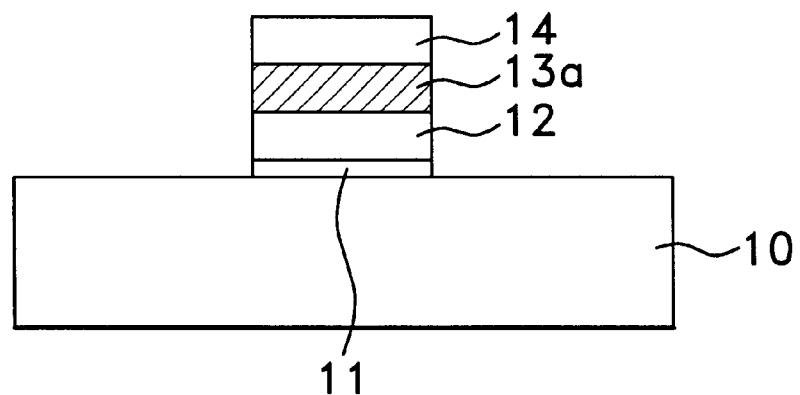
Figure 1E:
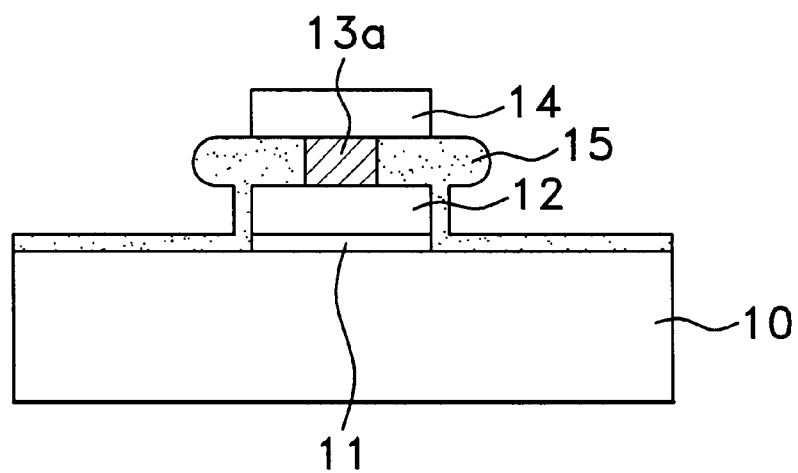
Figure 2A:
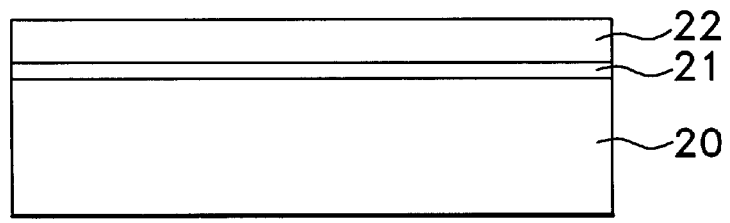
FIG. 2A to FIG. 2F are cross sectional views describing a method of forming a gate electrode with a titanium polycide structure according to an embodiment of the present invention.

Referring to FIG. 2A, a gate oxide layer 21 is grown on a silicon substrate 20 and a polysilicon layer 22 is then formed thereon by Low Pressure Chemical Vapor Deposition (LPCVD).

Figure 2B:
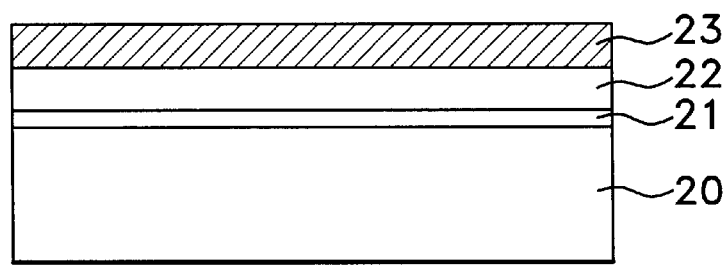

Referring to FIG. 2B, a $TiSi_x$ layer of an amorphous phase is deposited on the polysilicon layer 22 by PVD using a $TiSi_x$ target (x=2.0~2.2). Preferably, the $TiSi_x$ layer is formed to the thickness of 500 to 1,000 Å. Next, thermal-treating is performed at the temperature of 700 to 900° C. for 10 to 60 seconds, to transform the $TiSi_x$ layer of the amorphous phase into a $TiSi_2$ layer 23 of a crystalline phase.

Figure 2C:
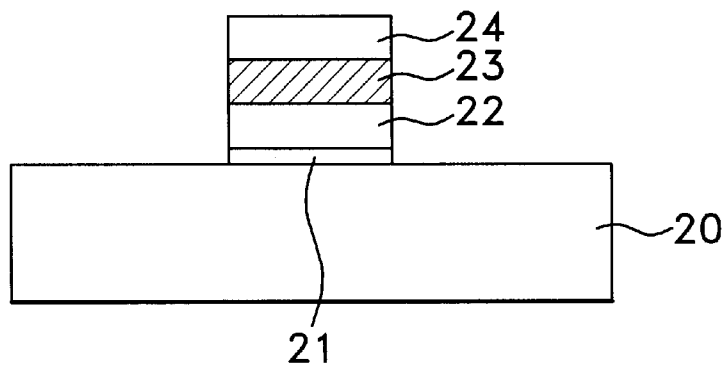

Referring to FIG. 2C, for subsequent self aligned contact (SAC), a mask oxide layer(or nitride layer) 24 is deposited on the $TiSi_2$ layer 23. Thereafter, the mask oxide layer 24, the $TiSi_x$ layer 23, the polysilicon layer 22 and the gate oxide layer 21 are sequentially etched to form a gate electrode.

Figure 2D:
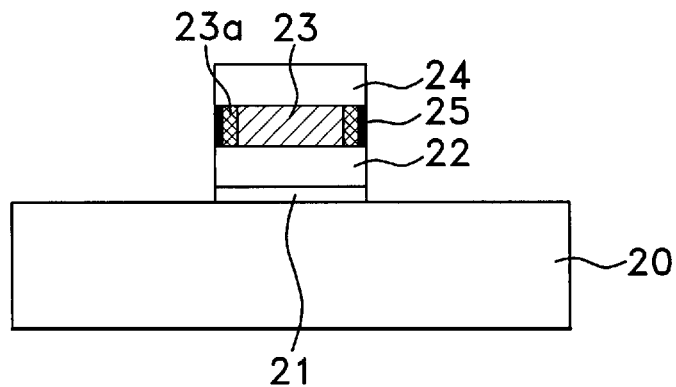

Referring to FIG. 2D, thermal-treating is performed at the temperature of 750 to 900° C. for 30 to 60 minutes under nitrogen atmosphere. Therefore, Ti of the $TiSi_2$ layer 23 is reacted with the nitrogen (N), so that a TiN layer 25 is formed on the side wall of the $TiSi_2$ layer. Furthermore, the $TiSi_2$ layer 23 adjacent to the TiN layer 25 is changed into a $TiSi_x$ 23a (for example, $x \geq 2.4$) in which Ti is deficient while Si is excessive.

Figure 2E:
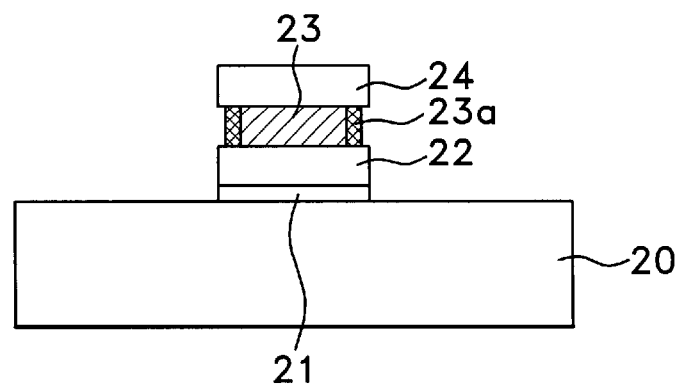

Referring to FIG. 2E, the TiN layer 25 is removed by wet etching using mixture solution of $NH_4OH$, $H_2O_2$, and $H_2O$. Preferably, the ratio of $NH_4OH:H_2O_2:H_2O$ is 1:1:5. Furthermore, the dipping time of the wet etching is 500 to 2,000 seconds and the temperature of the mixture solution is 20 to 30° C.

Figure 2F:
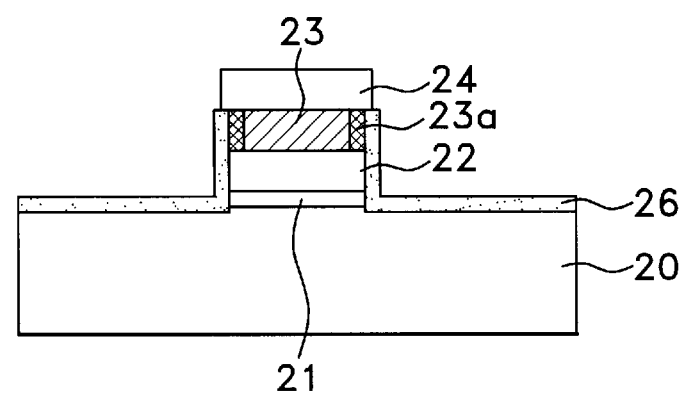

Referring to FIG. 2F, gate re-oxidation process is performed to uniformly form an oxide layer 26 on the side wall of the gate electrode and on the surface of the substrate 20. Preferably the gate re-oxidation process is performed at the temperature of 700 to 850° C. by dry oxidation. Furthermore, the thickness of the oxide layer 26 is 20 to 200 Å. At this time, owing to the $TiSi_x$ layer 23a having excessive Si formed on the side wall of the $TiSi_2$ layer, abnormal oxidation of the gate electrode is prevented.

According to the present invention, gate re-oxidation process is performed after forming a $TiSi_x$ layer having excessive Si on the side wall of a $TiSi_2$ layer of a gate electrode, so that abnormal oxidation of the $TiSi_2$ is prevented. Therefore, it is possible to obtain the gate electrode of a titanium polycide structure having good profile. As a result, the reliability of a semiconductor device is improved.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode with a titanium polycide structure, comprising the steps of:

forming a gate insulating layer and a polysilicon layer on a semiconductor substrate, in sequence;

forming a titanium silicide layer on the polysilicon layer;

sequentially etching the titanium silicide layer and the polysilicon layer to form a gate electrode;

thermal-treating the resultant substrate under nitrogen atmosphere to form a TiN layer on the side wall of the titanium silicide layer and to form an excessive silicon layer on the titanium silicide layer adjacent to the TiN layer;

removing the TiN layer; and performing gate re-oxidation process.

2. The method according to claim 1, wherein the thermal-treating is performed at the temperature of 750 to 900° C. for 30 to 60 minutes.

3. The method according to claim 1, wherein the step of forming the titanium silicide layer, comprising the steps of forming a titanium silicide of an amorphous phase; and performing rapid thermal process to transform the titanium silicide layer of the amorphous phase into a titanium silicide of a crystalline phase.

4. The method according to claim 3, wherein the titanium silicide layer of the amorphous phase is formed of a $TiSi_x$ layer having the mole ratio Si:Ti of 2.0 to 2.2.

5. The method according to claim 1, wherein the gate re-oxidation process is performed at the temperature of 700 to 750° C. by dry oxidation method.

6. The method according to claim 1, wherein the TiN layer is removed by wet etching using mixture solution of $NH_4OH$, $H_2O_2$ and $H_2O$.

7. The method according to claim 6, wherein the ratio of $NH_4OH:H_2O_2:H_2O$ is about 1:1:5.

8. The method according to claim 7, wherein in the step of removing the TiN layer, the dipping time of the wet etching is 500 to 2,000 seconds and the temperature of the mixture solution is 20 to 30° C.

9. The method according to claim 6, wherein in the step of removing the TiN layer, the dipping time of the wet etching is 500 to 2,000 seconds and the temperature of the mixture solution is 20 to 30° C.

* * * * *

UNITED STATES PATENT AND TRADEMARK OFFICE
CERTIFICATE OF CORRECTION

PATENT NO.     : 6,255,173 B1
DATED          : July 3, 2001
INVENTOR(S)    : Se Aug Jang It is certified that error appears in the above-identified patent and that said Letters Patent is hereby corrected as shown below:

Column 1,
Line 25, delete "IG" ad insert -- "1G" --.

Signed and Sealed this

Eleventh Day of February, 2003

JAMES E. ROGAN
*Director of the United States Patent and Trademark Office*